US011294819B2

(12) United States Patent
Ellis et al.

(10) Patent No.: US 11,294,819 B2
(45) Date of Patent: Apr. 5, 2022

(54) COMMAND OPTIMIZATION THROUGH INTELLIGENT THRESHOLD DETECTION

(71) Applicant: WESTERN DIGITAL TECHNOLOGIES, INC., San Jose, CA (US)

(72) Inventors: Robert Ellis, Phoenix, AZ (US); Kevin O'Toole, Chandler, AZ (US); Jacob Schmier, Gilbert, AZ (US); Todd Lindberg, Phoenix, AZ (US); Atif Hussain, Longmont, CO (US); Venugopal Garuda, Denver, CO (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 184 days.

(21) Appl. No.: 16/835,836

(22) Filed: Mar. 31, 2020

(65) Prior Publication Data

US 2021/0303474 A1 Sep. 30, 2021

(51) Int. Cl.

| G06F 13/00 | (2006.01) |
| G06F 12/0882 | (2016.01) |
| G06F 9/30 | (2018.01) |
| G06F 12/02 | (2006.01) |
| G06F 13/16 | (2006.01) |
| G11C 16/26 | (2006.01) |
| G11C 16/30 | (2006.01) |

(52) U.S. Cl.
CPC ...... *G06F 12/0882* (2013.01); *G06F 9/30029* (2013.01); *G06F 12/0246* (2013.01); *G06F 13/1668* (2013.01); *G11C 16/26* (2013.01); *G11C 16/30* (2013.01)

(58) Field of Classification Search
CPC ............ G06F 12/0882; G06F 9/30029; G06F 12/0246; G06F 13/1668; G06F 2212/1024; G06F 2212/7201; G06F 2212/7206; G11C 16/26; G11C 16/30; G11C 11/5642; G11C 29/021; G11C 29/028
USPC ........................................................ 711/154
See application file for complete search history.

(56) References Cited

U.S. PATENT DOCUMENTS

| 8,259,506 B1 | 9/2012 | Sommer et al. |
| 8,751,726 B2 | 6/2014 | Katz et al. |
| 8,869,008 B2 | 10/2014 | Baum et al. |

(Continued)

*Primary Examiner* — Huan Hoang
*Assistant Examiner* — Minh Dinh
(74) *Attorney, Agent, or Firm* — Arent Fox LLP

(57) ABSTRACT

Aspects of a storage device including a memory and a controller are provided which prevent retransmissions of set features commands with identical read voltage threshold offsets for the same die. When the controller receives a first read command for data stored in the memory, the controller identifies a first parameter to modify a first read threshold, and executes a first set features command for modifying the read threshold based on the first parameter. Subsequently, when the controller receives a second read command from the host device for data stored in the memory, the controller identifies a second parameter to modify a second read threshold, and determines whether the first and second parameters are the same. If the parameters are the same, the controller refrains from executing a second set features command for modifying the second read threshold. Thus, the read latency of the storage device may be reduced.

20 Claims, 8 Drawing Sheets

(56) References Cited

U.S. PATENT DOCUMENTS

| | | |
|---|---|---|
| 9,146,850 B2 | 9/2015 | Fitzpatrick et al. |
| 9,251,053 B2 * | 2/2016 | Hyun .................. G06F 12/0646 |
| 9,298,549 B2 | 3/2016 | Camp et al. |
| 10,347,331 B2 | 7/2019 | Zhang et al. |
| 2012/0008414 A1 | 1/2012 | Katz et al. |
| 2012/0320671 A1 | 12/2012 | Meir et al. |
| 2016/0049203 A1 * | 2/2016 | Alrod .................... G06F 11/073 714/2 |
| 2018/0047444 A1 * | 2/2018 | Pignatelli ............. G11C 29/021 |

* cited by examiner

COMMAND OPTIMIZATION THROUGH INTELLIGENT THRESHOLD DETECTION

BACKGROUND

Field

This disclosure is generally related to electronic devices and more particularly to storage devices.

Background

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

When the flash storage device reads data from a cell of the flash memory, e.g. from a memory location such as a block, a read voltage of the cell is compared against one or more read voltage thresholds, and the data stored in the cell (e.g. a logic 0 or 1) is identified based on the comparison. In some cases, the flash storage device may perform dynamic reads, during which the read voltage threshold(s) may be offset using a set features command prior to each read in order to clearly identify the stored data in the cell. However, sending a set features command before each read may take significant time relative to the read sense command (e.g. approximately 2 µs compared to less than 1 µs for a read), thus increasing read latency and impacting the performance of the flash storage device.

SUMMARY

One aspect of a storage device is disclosed herein. The storage device includes a memory and a controller. The memory includes a first memory location and a second memory location. The controller is configured to receive a first read command from a host device for data stored in the first memory location, to identify a first parameter to modify a first read threshold associated with the first memory location, and to execute a first set features command for modifying the first read threshold based on the first parameter. The controller is further configured to receive a second read command from the host device for data stored in the second memory location, to identify a second parameter to modify a second read threshold associated with the second memory location, and to refrain from executing a second set features command for modifying the second read threshold when the second parameter is the same as the first parameter.

One aspect of a method is disclosed herein. The method includes receiving a first read command from a host device for data stored in a first memory location of a memory of a storage device, identifying a first parameter to modify a first read threshold associated with the first memory location, and executing a first set features command for modifying the first read threshold based on the first parameter. The method further includes receiving a second read command from the host device for data stored in a second memory location of the memory of the storage device, identifying a second parameter to modify a second read threshold associated with the second memory location, and refraining from executing a second set features command for modifying the second read threshold when the second parameter is the same as the first parameter.

A further aspect of a storage device is disclosed herein. The storage device includes a memory and a controller. The memory includes a first memory location and a second memory location. The controller is configured to receive a first read command from a host device for data stored in the first memory location, to identify a first parameter to modify a first read threshold associated with the first memory location, to execute a first set features command for modifying the first read threshold based on the first parameter, to receive a second read command from the host device for data stored in the second memory location, and to identify a second parameter to modify a second read threshold associated with the second memory location. The storage device also includes means for comparing the first parameter with the second parameter. The controller is further configured to determine when the second parameter is the same as the first parameter based on the means for comparing, and to refrain from executing a second set features command for modifying the second read threshold when the second parameter is the same as the first parameter.

It is understood that other aspects of the storage device and method will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
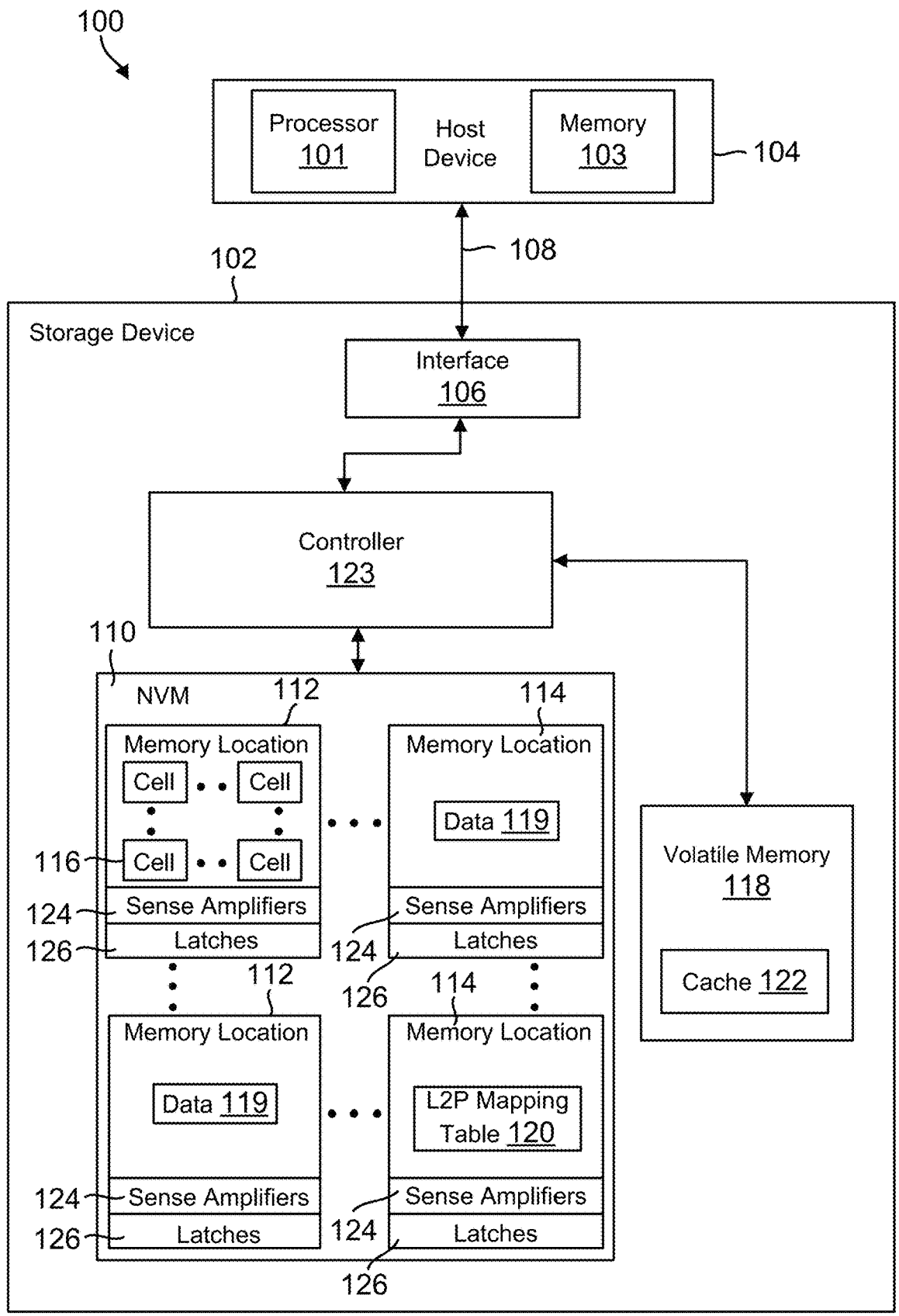
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

When a storage device performs multiple dynamic reads of a single die, the storage device generally sends a set features command prior to each read. Each set features command may include one or more read voltage threshold offsets, which modify the default, programmed read voltage threshold(s) of cells to assist the storage device in clearly identifying the data stored in the cells (e.g. as a logic 0 or 1). However, in certain cases such as dynamic reads of the same die, multiple set features commands may be provided that indicate the same read voltage threshold offsets. Such duplicative set features commands may be inefficient, increasing the read latency and affecting the performance of the storage device.

To improve storage device performance, the present disclosure allows a controller of the storage device to refrain from sending multiple set features commands with identical read voltage threshold offsets based on a threshold history buffer for each die or page, and a comparator such as an XOR engine. When the controller performs an initial dynamic read, the controller identifies a parameter, e.g., a threshold vector, indicating a read voltage threshold offset for the cells of a memory location (such as a block of a die). The controller then stores the parameter in the threshold history buffer for that die (or page), e.g., as a last threshold vector. The controller executes an initial set features command including this parameter to modify the read voltage threshold, and then the controller performs the dynamic read accordingly. Afterwards, when the controller performs another dynamic read for that die, the controller identifies a new parameter, e.g. a target threshold vector, indicating another read voltage threshold offset.

However, before executing another set features command including this new parameter, the controller uses the comparator to determine whether the new parameter (the target threshold vector) is the same as the stored parameter (the last threshold vector). If the parameters are the same (e.g. an XOR result is 0 or an XNOR result is non-zero), the controller determines that the read voltage threshold offset has not changed, and the controller refrains from sending another set features command prior to performing the subsequent dynamic read. Otherwise, if the parameters are different (e.g. an XOR result is non-zero or an XNOR result is 0), the controller executes another set features command with the new offset prior to performing the subsequent dynamic read, and the threshold history buffer for that die or page is overwritten with the new parameter indicating the offset. In this way, the storage device may refrain from retransmitting set features commands with the same read voltage threshold offset when dynamically reading the same die, thereby reducing overall read latency and improving storage device performance.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

As shown in the exemplary embodiment of FIG. 1, the storage device 102 includes non-volatile memory (NVM) 110 for non-volatilely storing data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the illustrated exemplary embodiment of FIG. 1, each memory location 112 may be a block 114 including multiple cells 116. The cells 116 may be single-level cells, multi-level cells, triple-level cells, quad-level cells, and/or penta-level cells, for example. Other examples of memory locations 112 are possible; for instance, each memory location may be a die containing multiple blocks. Moreover, each memory location may include one or more blocks in a 3-D NAND array. Moreover, the illustrated memory locations 112 may be logical blocks which are mapped to one or more physical blocks.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
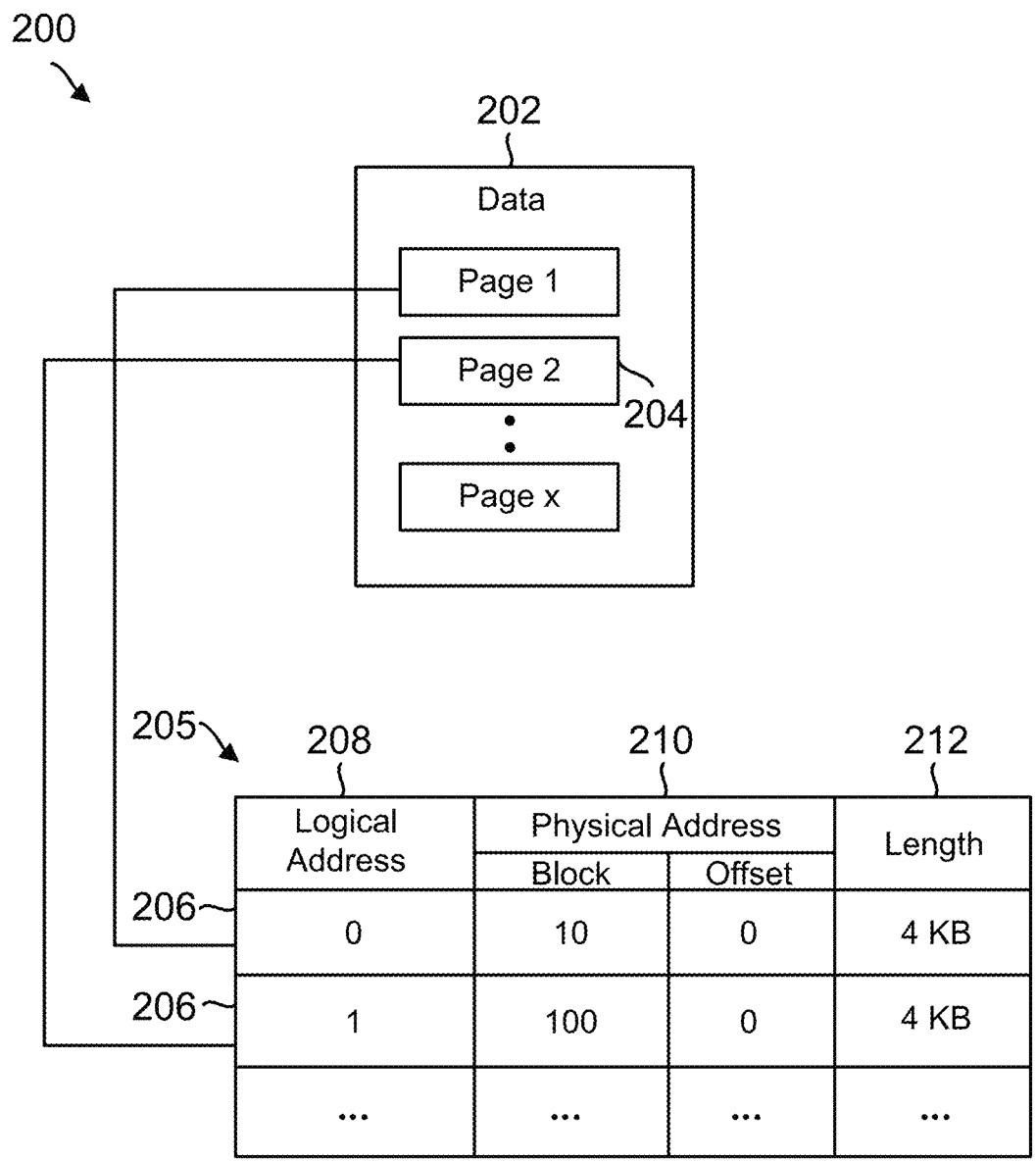
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
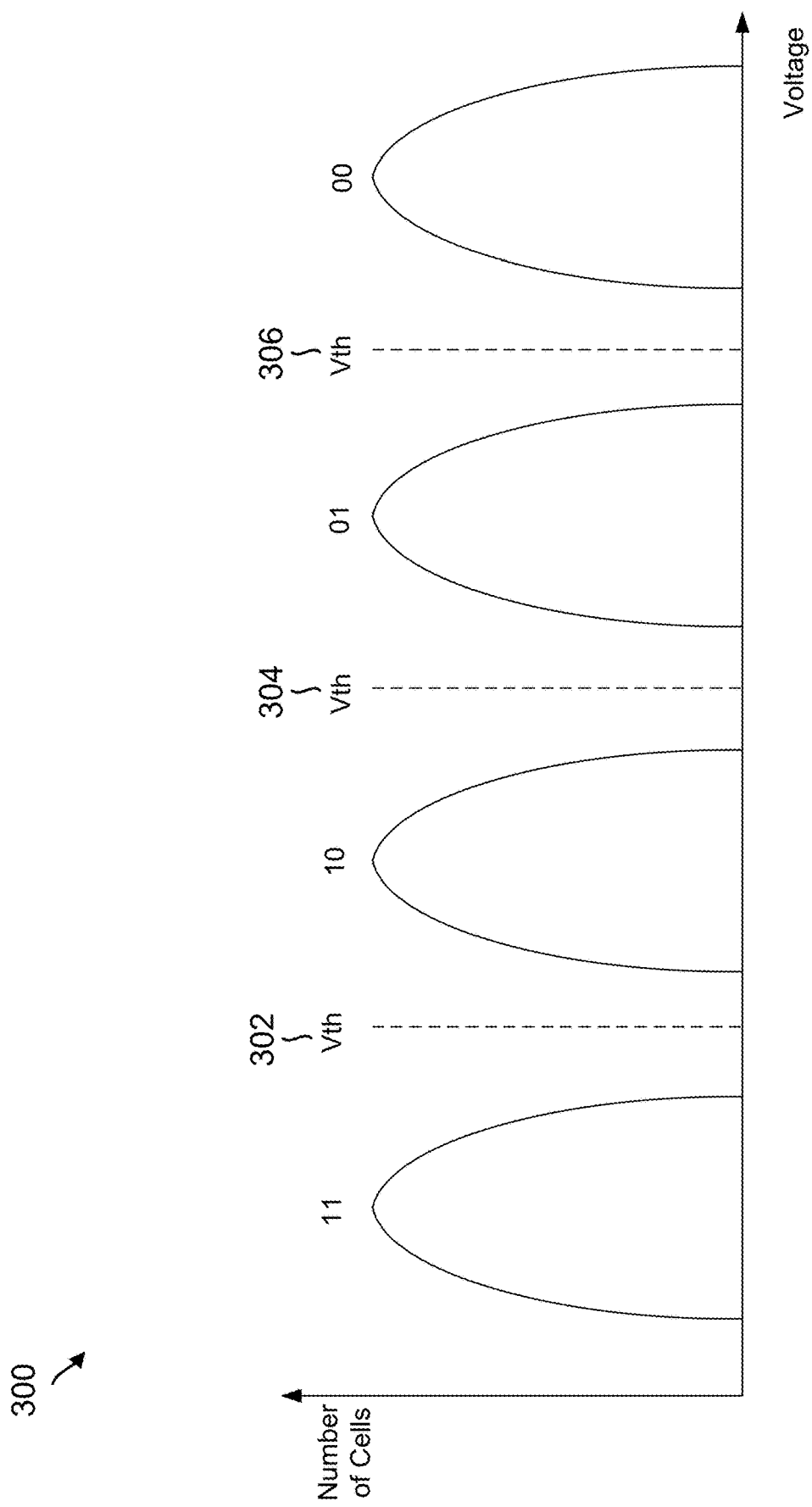
FIG. 3 is a conceptual diagram illustrating an example of a voltage distribution chart for multi-level cells in the storage device of FIG. 1.

When the controller 123 reads data 119 from the NVM 110 as described above, the controller compares the voltage in the cells 116 with one or more read voltage thresholds to determine the logical value of the data. FIG. 3 illustrates an example of a voltage distribution chart 300 for multi-level cells storing two bits of data (e.g. a logic 00, 01, 10, or 11). The logical value of each multi-level cell may be determined based on a comparison of a voltage in the cell with read threshold voltages 302, 304, 306. For example, the controller may determine that a particular cell stores data corresponding to logic '11' when the voltage of the cell is below read threshold voltage 302, logic '10' when the voltage is between read threshold voltage 302 and read threshold voltage 304, logic '01' when the voltage is between read threshold voltage 304 and read threshold voltage 306, or logic '00' when the voltage is above read threshold voltage 306. While FIG. 3 illustrates three read threshold voltages for multi-level cells, the number of read threshold voltages may change depending on the amount of data that is stored in each cell (e.g. one threshold voltage for single-level cells, seven threshold voltages for triple-level cells, etc.).

Although the controller 123 may read data 119 from cells 116 using default read voltages (e.g. read threshold voltages 302, 304, 306), in some cases the read threshold voltages may not clearly differentiate the stored data in the cells (e.g. as a logic 00, 01, etc.). For example, in some cases the read threshold voltages 302, 304, 306 may overlap with one or more of the respective curves of FIG. 3, resulting in possible data read errors. In such cases, the controller may reduce read errors by performing a dynamic read operation, e.g. dynamically applying read threshold voltage offsets to modify the default read thresholds when reading the data. To modify the read thresholds, the controller 123 may send a set features command.

Figure 4:
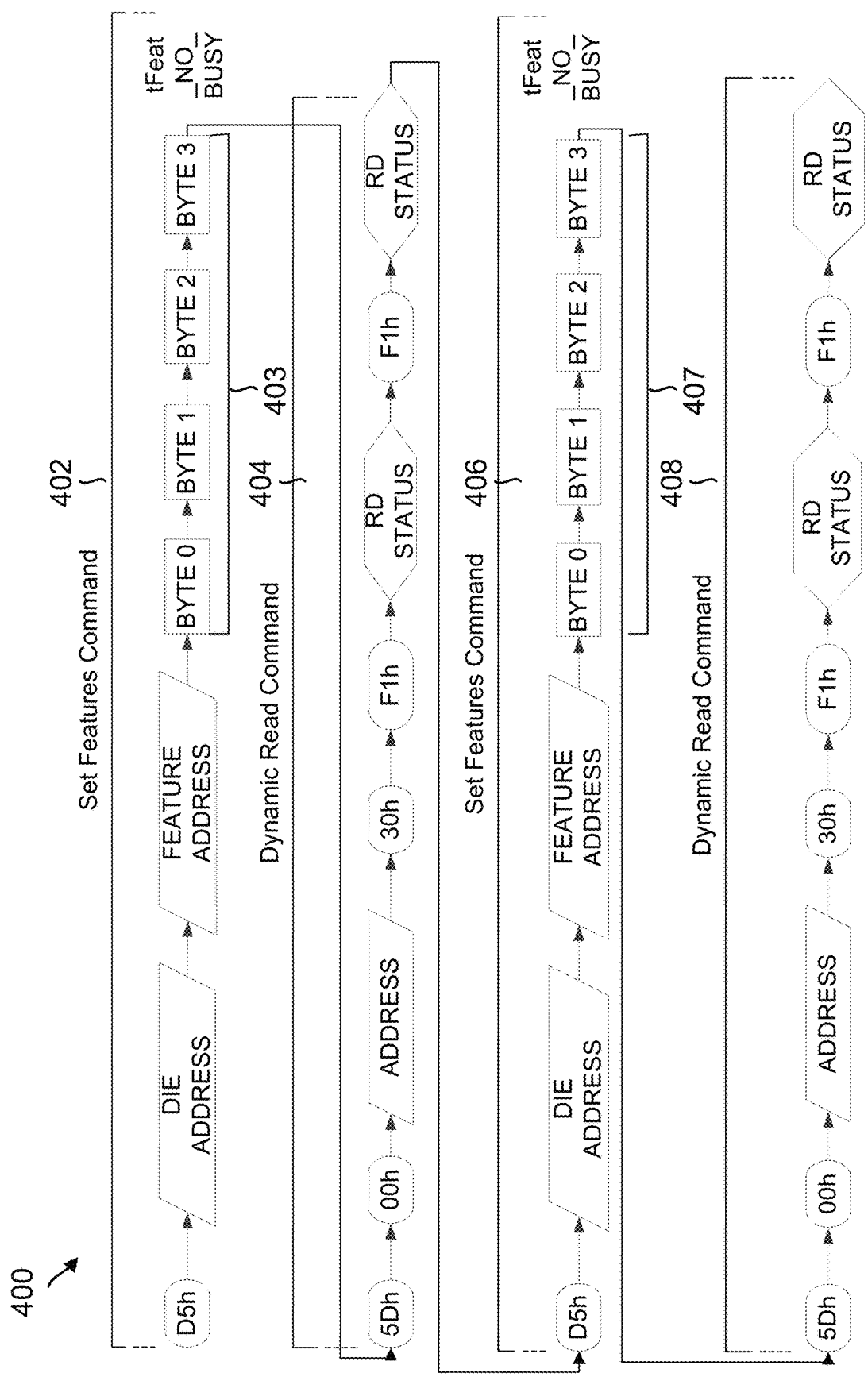
FIG. 4 is a conceptual diagram illustrating an example of a set features command that is executed prior to each dynamic read command by the storage device of FIG. 1.

FIG. 4 illustrates an example 400 of multiple dynamic read commands preceded by individual set features commands. When the controller 123 receives a first read command from host device 104, the controller may execute a first set features command 402 to modify the read voltage threshold(s) 302, 304, 306 prior to executing a first dynamic read command 404 for data requested by the host device.

Similarly, when the controller receives a second read command from the host device, the controller may execute a second set features command 406 to modify the read voltage threshold(s) prior to executing a second dynamic read command 408 for data requested by the host device. Each dynamic read command may request data in a single plane of a particular die (e.g. a single plane dynamic read).

In one example, when the controller 123 executes a set features command 402, 406, the controller may send to a sequencer in the NVM 110 a value indicating the command (e.g. D5h for set features), a die address indicating the target die for the command, a feature address indicating a feature register for storing the voltage threshold offsets, and one or more parameter(s) 403, 407 (e.g. a sequence of four bytes) indicating the voltage threshold offsets to be stored in the feature register. In some cases, the controller may subsequently track an internal busy status of the die (e.g. through status queries) before proceeding to send the dynamic read command 404, 408. Alternatively, the controller may refrain from tracking the internal busy status and wait a period of time (e.g. tFeat_NO_BUSY or approximately 700 ns or another number) prior to sending the dynamic read command, which may optimally save more time (e.g. at least 300-400 ns) than tracking the internal busy status.

After executing the set features command 402, 406, when the controller 123 executes the dynamic read command 404, 408, the controller may send to the sequencer values indicating the command (e.g. 5Dh for dynamic read, followed by 00h and 30h for the read operation), a physical address to read the data (e.g. physical address 210), and status commands (e.g. F1h) which may repeat until the controller receives an indication that the die is ready. The parameters 403, 407 stored in the feature register may be used to offset the read voltage thresholds when reading the data from the cells. Once the data is dynamically read, the data is subsequently transferred to the controller, e.g. to volatile memory 118 for transfer to the host device.

Figure 5:
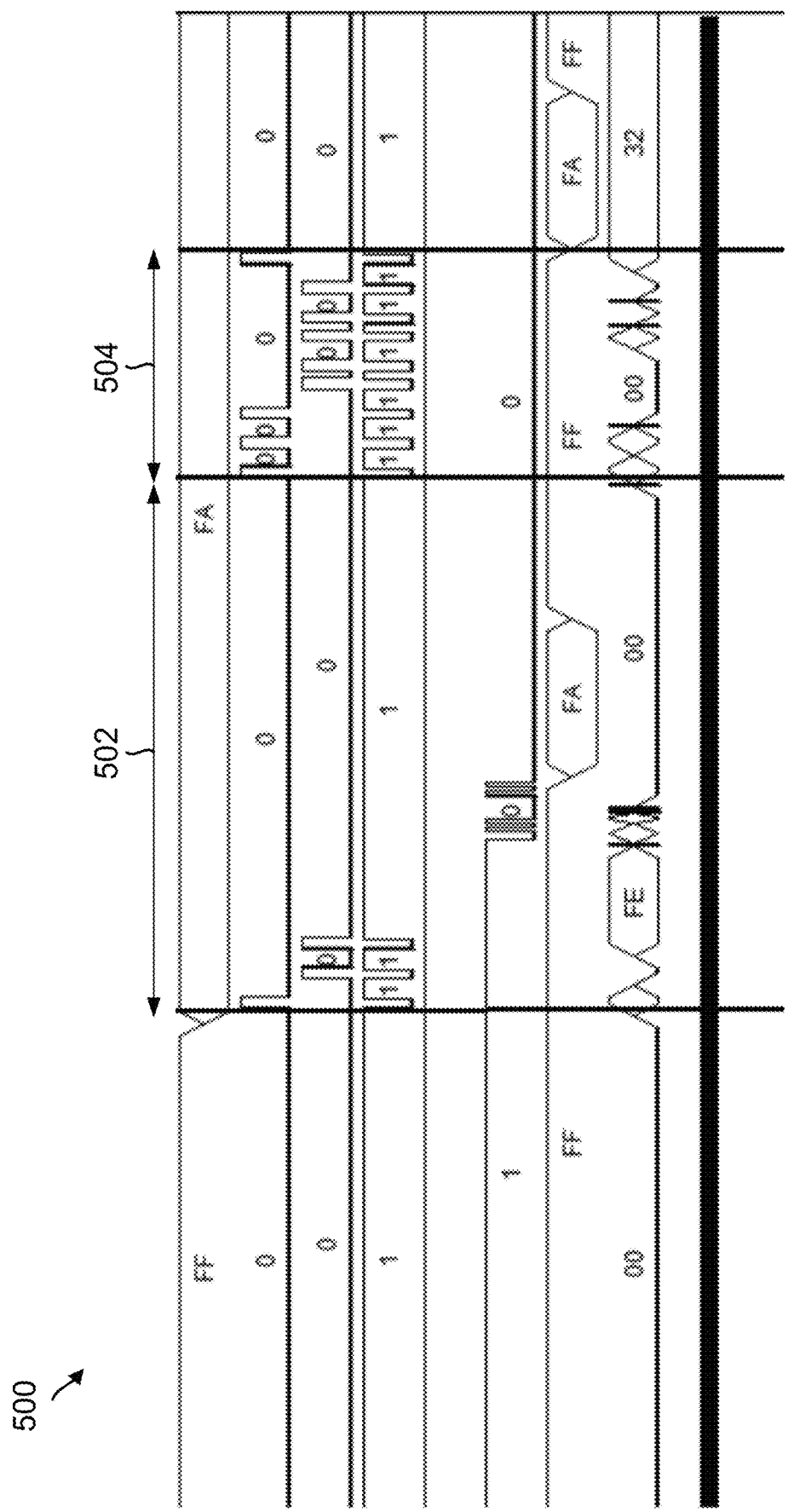
FIG. 5 is a conceptual diagram illustrating an example of a timing chart for each set features command and dynamic read command in FIG. 4.

However, when the storage device 102 heavily relies on dynamic read commands 404, 408 to read data based on voltage threshold offsets, sending a set features command 402, 406 prior to each dynamic read command may increase the read latency of the storage device. FIG. 5 illustrates a timing diagram 500 showing an example of the timing difference between a set features command and a dynamic read command. As shown in the diagram, a timing 502 for executing a set features command may be significantly longer than a timing 504 for executing a dynamic read command. For instance, while the timing 504 to complete a read sense command may be less than 1 µs, the timing 502 to construct and send a set features command (even when optimized to not use busy status tracking as described above) may be approximately 2 µs. Thus, when a set features command is re-transmitted prior to each read sense command, the overall impact to the read latency of the storage device may be significant, especially for random reads where more dynamic read commands may be executed than for sequential reads.

Figure 6:
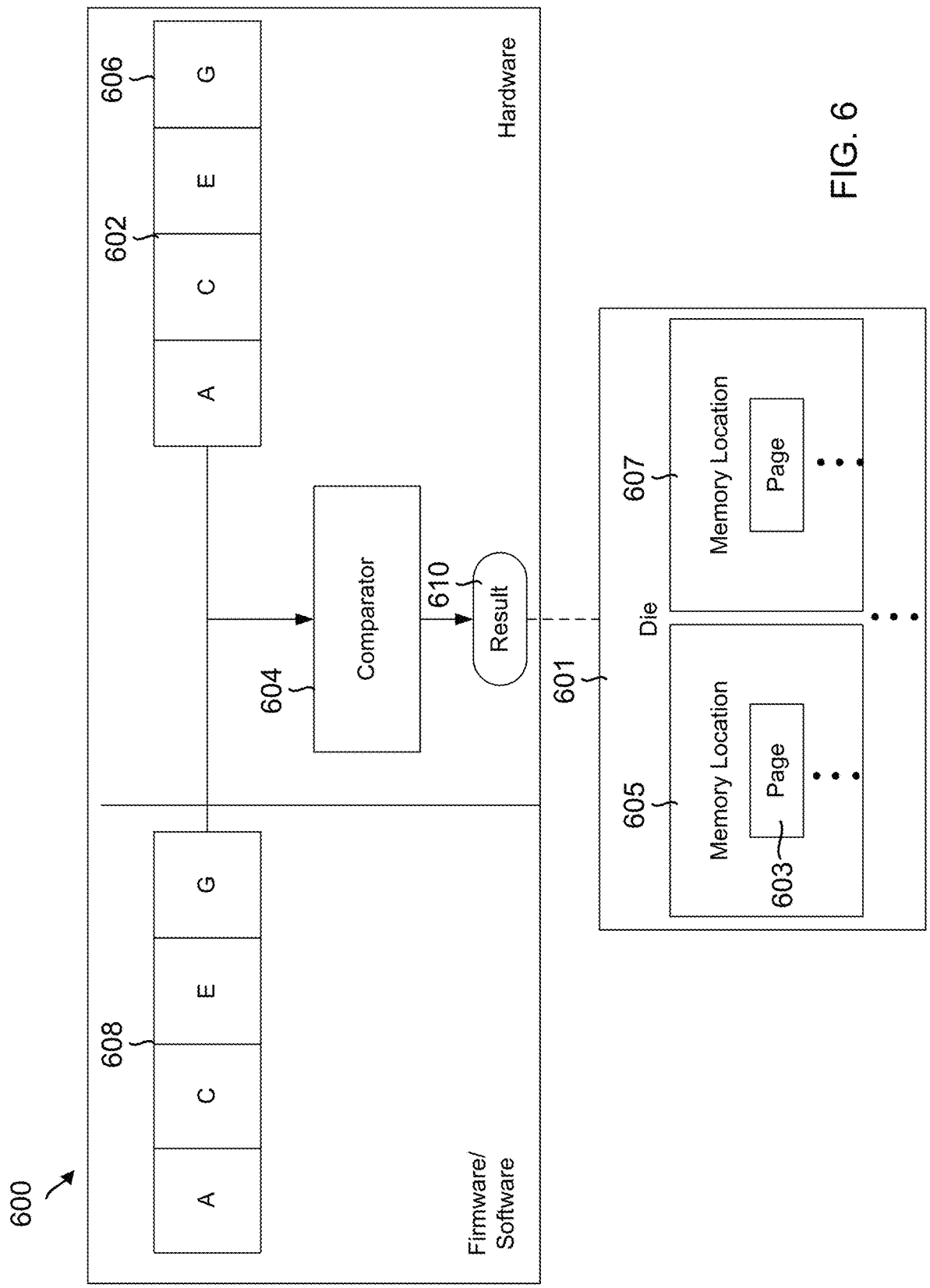
FIG. 6 is a conceptual diagram illustrating an example of a threshold history buffer and a comparator used by the storage device of FIG. 1 to refrain from executing multiple set features commands with identical read voltage threshold offsets.

To address this issue, FIG. 6 illustrates an example 600 of a threshold history buffer 602 and comparator 604 which may be used for minimizing re-transmission of set features commands (e.g. second set features command 406) to reduce the aforementioned read latency. The threshold history buffer 602 may be a buffer in volatile memory 118 (e.g. cache 122) that stores a most recent or last threshold vector for a die. The last threshold vector may be the parameter 403, 407 identified in the set features command 402, 406, which indicates the read threshold voltage offset(s) for a particular die. For instance, referring to FIG. 4, the last threshold vector may correspond to parameter 403 (e.g. the sequence of four bytes) in set features command 402 when dynamic read command 404 is the most recently executed read command. The threshold history buffer 602 may be implemented in firmware/software, or in hardware (e.g. an ASIC) as illustrated in FIG. 6. For instance, the threshold history buffer may include one or more data latches that are wired to the feature register which stores the voltage threshold offsets as described above.

In one example, the threshold history buffer 602 may be associated with an individual die 601. For instance, multiple threshold history buffers 602 may be present in hardware, with each buffer associated with a respective die. Thus, each threshold history buffer may store the last threshold vector for a different die. For instance, if set features commands 402 and 406 include different die addresses, parameter 403 may be stored in one threshold history buffer associated with the first die address, and parameter 407 may be stored in another threshold history buffer associated with the second die address.

In another example, the threshold history buffer 602 may be associated with an individual page 603 of a memory location 605. Memory location 605 may correspond to memory location 112, e.g. block 114. For example, multiple threshold history buffers 602 may be present in hardware, with each buffer associated with a respective page of a block of a die. Thus, each threshold history buffer may store the last threshold vector for a different page. For instance, if dynamic read commands 404, 408 include different physical addresses (associated with different pages), parameter 403 may be stored in one threshold history buffer associated with the first page, and parameter 407 may be stored in another threshold history buffer associated with the second page.

Each threshold history buffer 602 may include one or more indicators 606 or variables (e.g. A, C, E, G) that represent individual components or voltage settings of the last threshold vector. For instance, the first indicator A may represent the first byte of parameter 403, the second indicator C may represent the second byte of parameter 403, the third indicator E may represent the third byte of parameter 403, and the fourth indicator G may represent the fourth byte of parameter 403. While the threshold history buffer 602 illustrated in FIG. 6 spans four bytes (32 bits) with four indicators (A, C, E, G), the threshold history buffer 602 may alternatively span other lengths or include other numbers of indicators 606 based on a length or composition of parameter 403. For instance, if parameter 403 is a single byte, threshold history buffer 602 may include four indicators each representing 2 bits of parameter 403, one indicator representing the entire 8 bits of parameter 403, or other examples.

The comparator 604 may receive, as an input, data from the threshold history buffer 602. The comparator 604 may be implemented in firmware/software (e.g. as an XOR or XNOR operand), or in hardware as illustrated in FIG. 6. For instance, the comparator 604 may include XOR gates or XNOR gates that are wired to the threshold history buffer 602. The length of comparator 604 may correspond to the length of the threshold history buffer 602. For example, if threshold history buffer 602 spans 32 bits in length as described above, comparator 604 may include 32 XOR or XNOR gates which respectively receive individual bits from the threshold history buffer. Additionally, while FIG. 6 illustrates one comparator 604 and threshold history buffer 602, multiple comparators and threshold history buffers may be present. For instance, where multiple threshold history buffers are respectively associated with different dies (or pages) as described above, multiple comparators 604 may be included in hardware which are individually wired to respective threshold history buffers.

When the controller 123 receives a read command from the host device 104, the controller may identify a target threshold vector 608 indicating a read voltage threshold offset for reading the data from the NVM 110. For example, when the read command is the first read command associated with a particular die, the target threshold vector may correspond to parameter 403 of FIG. 4, which may be a sequence of bytes that indicate the read threshold voltage offset(s) for the die associated with the first read command (e.g. dynamic read command 404). Alternatively, when the read command is the second or later read command associated with the same die, the target threshold vector may correspond to parameter 407 of FIG. 4, which may be a sequence of bytes that indicate the read threshold voltage offset(s) for the die associated with the second or later read command (e.g. dynamic read command 408). The target threshold vector 608 may also have the same length as the last threshold vector in the threshold history buffer 602. For example, the target threshold vector 608 may similarly be represented by four indicators (A, C, E, and G), with each indicator representing a corresponding one of the four bytes of parameter 403 or 407 illustrated in FIG. 4.

In one example of operation, the controller may receive a first read command for reading data from memory location 605, 607 of die 601. In such case, the controller may identify an initial target threshold vector (e.g. parameter 403) to modify the read voltage threshold(s) for the cells or page 603 in that memory location, and the controller may send a set features command (e.g. set features command 402) prior to performing the read operation (e.g. dynamic read command 404). The threshold history buffer 602 for die 601 or page 603 may then be updated with the initial target threshold vector, thereby becoming the last threshold vector for the die or page. For example, when the threshold history buffer is implemented in firmware/software, the controller 123 may update the buffer with the most recently identified threshold vector. In another example, when the threshold history buffer is implemented in hardware, the threshold history buffer may be automatically updated with the read voltage threshold offsets from the feature register (e.g. in response to the set features command 402).

Subsequently, the controller may receive a second read command for reading data from memory location 605, 607 of die 601. In such case, the controller may identify a target threshold vector 608 (e.g. parameter 407) to modify the read voltage threshold(s) for the cells or page 603 in that memory location. However, the controller may refrain from sending another set features command (e.g. set features command 406) prior to performing the read operation (e.g. dynamic read command 408) if the threshold vector or offset(s) has not changed since the previous set features command.

To determine whether the offsets have changed, the controller uses comparator 604 to compare the target threshold vector 608 with the last threshold vector in threshold history buffer 602 corresponding to the die 601 or page 603. If a result 610 of the comparison indicates the parameters are the same, the controller refrains from re-transmitting the set features command, and the dynamic read command (e.g. dynamic read command 408) may be performed based on the previously stored voltage threshold offsets. Alternatively, if the result 610 of the comparison indicates the parameters are different, the controller re-transmits the set features command (e.g. set features command 406) and performs the dynamic read command based on the updated voltage threshold offsets. For example, if the comparator 604 includes XOR gates, the controller may refrain from re-transmitting the set features command when the result 610 is zero, and the controller may re-transmit the set features command when the result 610 is non-zero. Similarly, if the comparator 604 includes XNOR gates, the controller may refrain from re-transmitting the set features command when the result 610 is non-zero, and the controller may re-transmit the set features command when the result 610 is zero. The threshold history buffer 602 may then be updated with the target threshold vector, thereby becoming the last threshold vector for the die 601 or page 603. For instance, when the threshold history buffer is implemented in hardware, the threshold history buffer may be automatically updated with the modified read voltage threshold offsets from the updated feature register (e.g. in response to the set features command 406).

Figure 7:
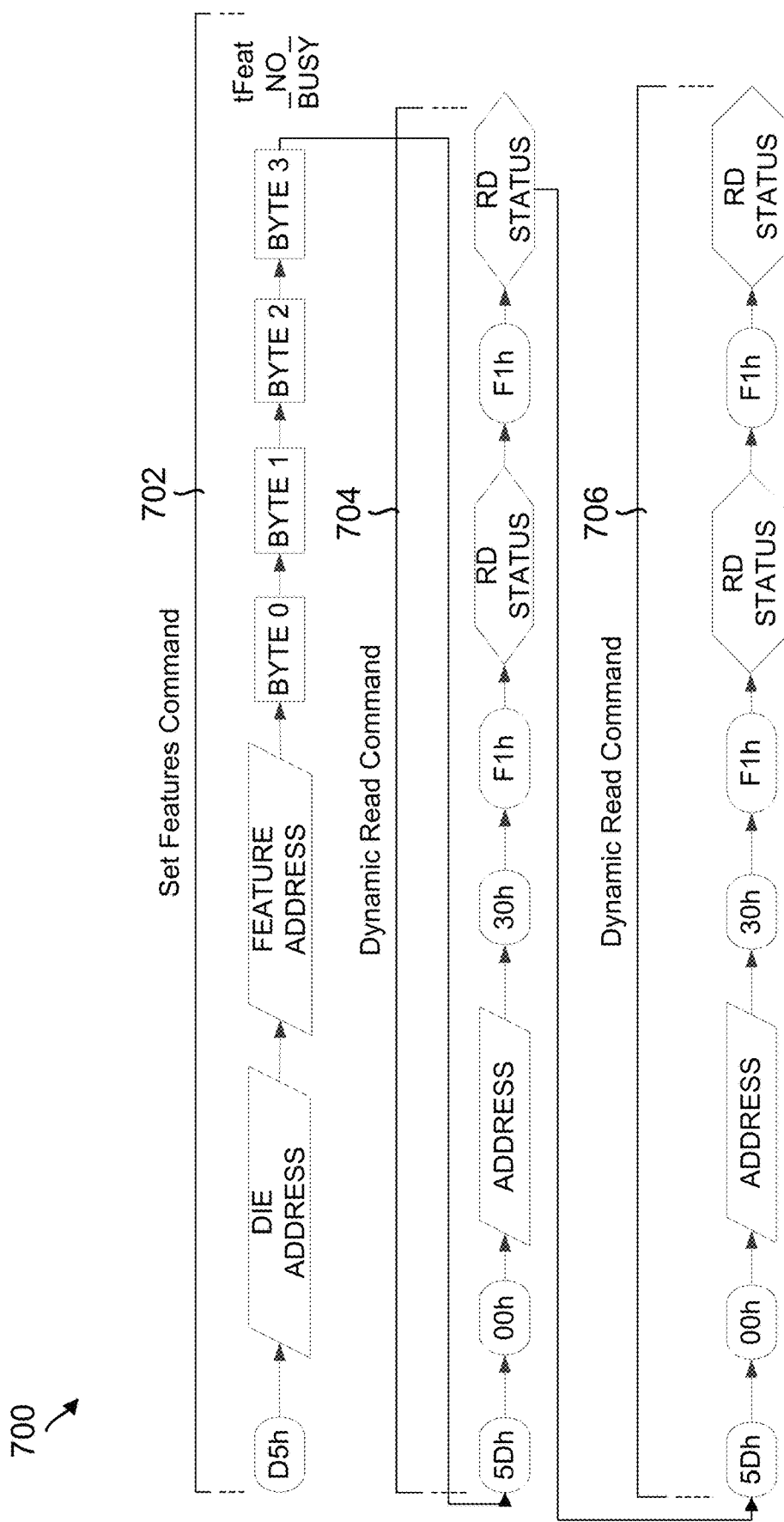
FIG. 7 is a conceptual diagram illustrating an example of a set features command that is executed for an initial dynamic read command but is refrained from being executed for subsequent dynamic read commands by the storage device of FIG. 1.

As a result, since the storage device may refrain from sending duplicate set features commands when the read voltage threshold offset is unchanged, the read latency of the storage device may be reduced. For instance, FIG. 7 illustrates an example 700 of a modified command sequence with respect to FIG. 4 in which the controller may refrain from re-transmitting set features commands for the same die based on the result 610 of the comparison of threshold vectors in FIG. 6. For instance, while the controller may send an initial set features command 702 in response to a read command from a host device prior to sending an initial dynamic read command 704 for a particular die, the controller may refrain from sending another set features command in response to a subsequent read command prior to sending another dynamic read command 706 based on the threshold vector comparison described above.

Figure 8:
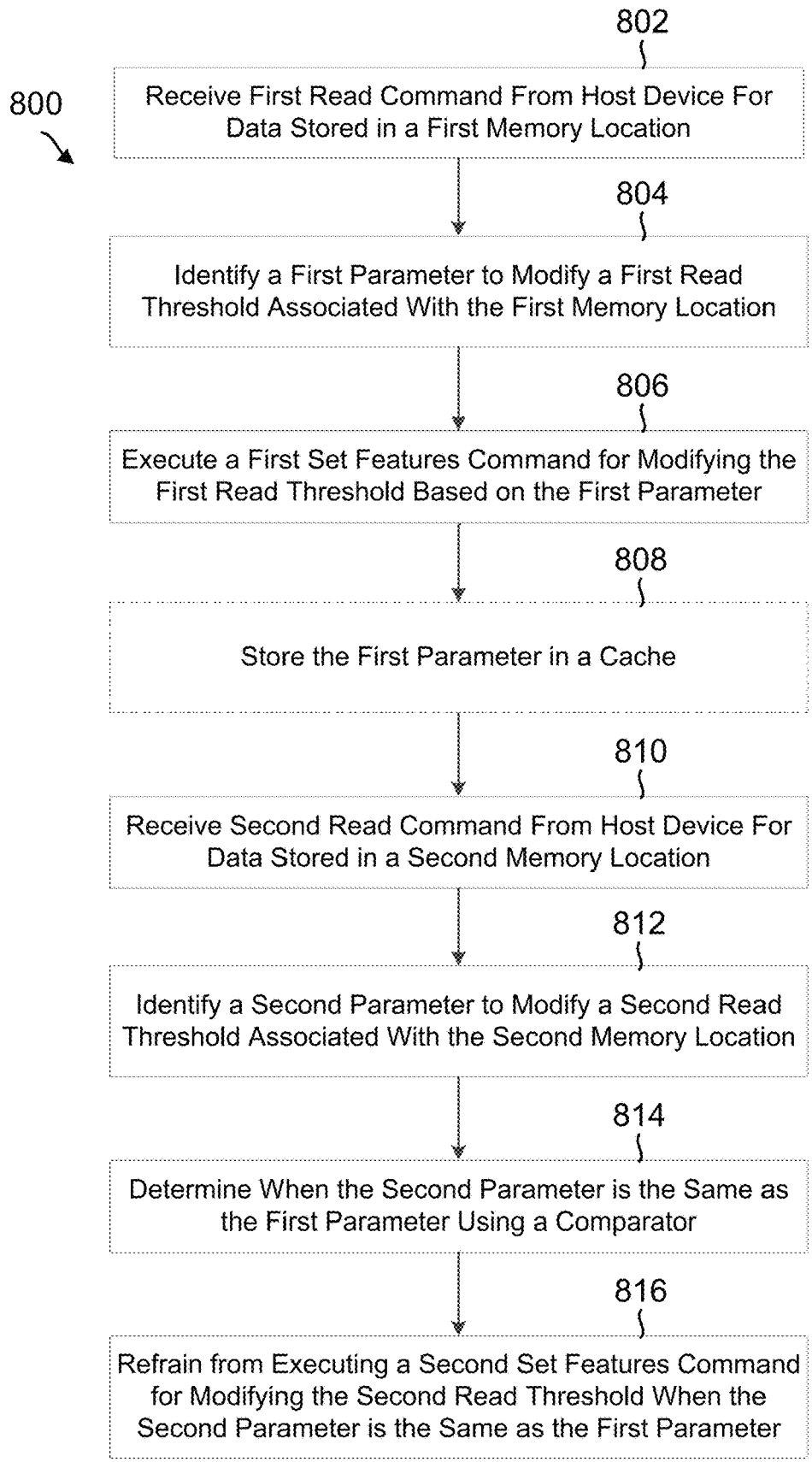
FIG. 8 is a flow chart illustrating a method for preventing retransmission of multiple set feature commands with identical read voltage threshold offsets by the storage device of FIG. 1.

FIG. 8 illustrates an example flow chart 800 of a method for preventing retransmission of multiple set feature commands with identical read voltage threshold offsets. For example, the method can be carried out in a storage device 102 such as the one illustrated in FIG. 1. Each of the steps in the flow chart can be controlled using the controller as described below (e.g. controller 123), or by some other suitable means. Optional aspects are illustrated in dashed lines.

As represented by block 802, the controller receives a first read command from a host device for data stored in a first memory location of a memory. For example, referring to FIGS. 1 and 6, the controller 123 may receive a first read command from the host device 104 for data 119 stored in a memory location 112 (e.g. memory location 605) of the NVM 110.

As represented by block 804, the controller identifies a first parameter to modify a first read threshold associated with the first memory location. The first parameter may comprise a first voltage setting. The first parameter may also indicate a die having the first memory location. Moreover, the first parameter may indicate a first page of the first memory location. For example, referring to FIGS. 1, 3, 4 and 6, the controller 123 may identify parameter 403, e.g. a threshold vector including one or more indicators 606 (e.g. voltage settings or read voltage threshold offsets) to modify a read voltage threshold 302, 304, 306 of cells 116 in the memory location 605 of a die 601. The threshold vector may be stored in a threshold history buffer 602 that is associated with die 601 or with a page 603 of the memory location 605 in die 601 corresponding to the read command. Thus, the parameter 403 may indicate the die 601 or page 603 (e.g. based on the threshold history buffer association).

As represented by block 806, the controller executes a first set features command for modifying the first read threshold based on the first parameter. For example, referring to FIGS. 1 and 4, the controller 123 may execute set features command 402 for modifying the read threshold voltage(s) 302, 304, 306 based on parameter 403.

As represented by block 808, the controller may store the first parameter in a cache of the memory. For example, referring to FIGS. 1, 4, and 6, the controller 123 may store the parameter 403 in the threshold history buffer 602 as the last threshold vector for the page 603 or die 601. The threshold history buffer 602 may be stored in the volatile memory 118 (e.g. in cache 122).

As represented by block 810, the controller receives a second read command from the host device for data stored in the second memory location of the memory. For example, referring to FIGS. 1 and 6, the controller 123 may receive a second read command from the host device 104 for data 119 stored in a memory location 112 (e.g. memory location 607) of the NVM 110.

As represented by block 812, the controller identifies a second parameter to modify a second read threshold associated with the second memory location. The second parameter may comprise a second voltage setting. The second parameter may also indicate the die having the second memory location. Moreover, the second parameter may indicate a second page of the second memory location. For example, referring to FIGS. 1, 3, 4 and 6, the controller 123 may identify parameter 407, e.g. a target threshold vector 608 including one or more indicators 606 (e.g. voltage settings or read voltage threshold offsets) to modify a read voltage threshold 302, 304, 306 of cells 116 in the memory location 607 of die 601. The target threshold vector 608 may subsequently overwrite the data in the threshold history buffer 602 associated with die 601 or with a page 603 of the memory location 607 in die 601 corresponding to the read command. Thus, the parameter 407 may indicate the die 601 or page 603 (e.g. based on the threshold history buffer association).

As represented by block 814, the controller determines when the second parameter is the same as the first parameter using a comparator. For example, the comparator may comprise one or more exclusive-or (XOR) gates or exclusive-nor (XNOR) gates. For instance, referring to FIGS. 1, 4, and 6, the controller 123 may determine whether parameter 403 (the last threshold vector in threshold history buffer 602) is the same as parameter 407 (the target threshold vector 608) using the comparator 604. The comparator 604 may include XOR gates or XNOR gates, for example.

The comparator 604 may provide a means for comparing the last threshold vector in threshold history buffer 602 (a first parameter) with the target threshold vector 608 (a second parameter). In one example, the comparator 604 may be implemented using the one or more processors of controller 123. For instance, the comparator 604 may be implemented in firmware/software (e.g. as an XOR or XNOR operand). In another example, the comparator 604 may be implemented in hardware as illustrated in FIG. 6. For instance, the comparator 604 may include XOR gates or XNOR gates that are wired to the threshold history buffer 602. The length of comparator 604 may correspond to the length of the threshold history buffer 602. For example, if threshold history buffer 602 spans 32 bits in length, comparator 604 may include 32 XOR or XNOR gates which respectively receive individual bits from the threshold history buffer. Additionally, while FIG. 6 illustrates one comparator 604 and threshold history buffer 602, multiple comparators and threshold history buffers may be present. For instance, where multiple threshold history buffers are respectively associated with different dies (or pages) as described above, multiple comparators 604 may be included in hardware which are individually wired to respective threshold history buffers.

Finally, as represented by block 816, the controller may refrain from executing a second set features command for modifying the second read threshold when the second parameter is the same as the first parameter. For example, referring to FIGS. 1, 4, 6, and 7, the controller 123 may refrain from executing set features command 406 for modifying read voltage thresholds 302, 304, 306 when the parameters 403, 407 are the same as determined by comparator 604. Thus, as illustrated in FIG. 7, the controller 123 may send dynamic read command 706 without an immediately preceding set features command. Alternatively, if the second parameter is not the same as the first parameter, the controller 123 may execute the set features command 406. The threshold history buffer 602 may correspondingly be updated with the last threshold vector (parameter 407).

Accordingly, the present disclosure reduces the read latency caused by multiple set features commands with the same voltage threshold offsets for the same die. Dynamic reads performed on the same die may be minimized to a single set feature command, thereby reducing inefficient bus utilization caused by multiple set features commands with identical read voltage threshold offsets. Moreover, random read performance may be improved by saving significant time (e.g. 700 ns) for preparing subsequent dynamic read operations, thereby allowing more read operations to be performed in the saved time.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
a memory including a first memory location and a second memory location; and
a controller configured to receive a first read command from a host device for data stored in the first memory location, to identify a first parameter to modify a first read threshold associated with the first memory location, and to execute a first set features command for modifying the first read threshold based on the first parameter;
wherein the controller is further configured to receive a second read command from the host device for data stored in the second memory location, to identify a second parameter to modify a second read threshold associated with the second memory location, and to refrain from executing a second set features command for modifying the second read threshold when the second parameter is the same as the first parameter.

2. The storage device of claim 1, wherein the first parameter comprises a first voltage setting, and the second parameter comprises a second voltage setting.

3. The storage device of claim 1, wherein the memory further comprises cache, and wherein the controller is further configured to store the first parameter in the cache.

4. The storage device of claim 1, wherein the controller is further configured to determine when the second parameter is the same as the first parameter using a comparator.

5. The storage device of claim 4, wherein the comparator comprises one or more exclusive-or (XOR) gates or exclusive-nor (XNOR) gates.

6. The storage device of claim 1, wherein the memory includes a die having the first memory location and the second memory location, and wherein the first parameter and the second parameter each indicate the die.

7. The storage device of claim 1, wherein the first memory location includes a first page, wherein the second memory location includes a second page, and wherein the first parameter indicates the first page and the second parameter indicates the second page.

8. A method, comprising:
receiving a first read command from a host device for data stored in a first memory location of a memory of a storage device;
identifying a first parameter to modify a first read threshold associated with the first memory location;
executing a first set features command for modifying the first read threshold based on the first parameter;
receiving a second read command from the host device for data stored in a second memory location of the memory of the storage device;
identifying a second parameter to modify a second read threshold associated with the second memory location; and
refraining from executing a second set features command for modifying the second read threshold when the second parameter is the same as the first parameter.

9. The method of claim 8, wherein the first parameter comprises a first voltage setting, and wherein the second parameter comprises a second voltage setting.

10. The method of claim 8, further comprising:
determining when the second parameter is the same as the first parameter using a comparator.

11. The method of claim 10, wherein the comparator comprises one or more exclusive-or (XOR) gates or exclusive-nor (XNOR) gates.

12. The method of claim 8, wherein the memory includes a die having the first memory location and the second memory location, and wherein the first parameter and the second parameter each indicate the die.

13. The method of claim 8, wherein the first memory location includes a first page and the second memory location includes a second page, and wherein the first parameter indicates the first page and the second parameter indicates the second page.

14. A storage device, comprising:
a memory including a first memory location and a second memory location;
a controller configured to receive a first read command from a host device for data stored in the first memory location, to identify a first parameter to modify a first read threshold associated with the first memory location, to execute a first set features command for modifying the first read threshold based on the first parameter, to receive a second read command from the host device for data stored in the second memory location, and to identify a second parameter to modify a second read threshold associated with the second memory location; and
means for comparing the first parameter with the second parameter;
wherein the controller is further configured to determine when the second parameter is the same as the first parameter based on the means for comparing, and to refrain from executing a second set features command for modifying the second read threshold when the second parameter is the same as the first parameter.

15. The storage device of claim 14, wherein the first parameter comprises a first voltage setting, and the second parameter comprises a second voltage setting.

16. The storage device of claim 14, wherein the memory further comprises cache, and wherein the controller is further configured to store the first parameter in the cache.

17. The storage device of claim 14, wherein the means for comparing comprises one or more exclusive-or (XOR) gates.

18. The storage device of claim 14, wherein the means for comparing comprises one or more exclusive-nor (XNOR) gates.

19. The storage device of claim 14, wherein the memory includes a die having the first memory location and the second memory location, and wherein the first parameter and the second parameter each indicate the die.

20. The storage device of claim 14, wherein the first memory location includes a first page, wherein the second memory location includes a second page, and wherein the first parameter indicates the first page and the second parameter indicates the second page.

* * * * *